(12) United States Patent
Tamura et al.

(10) Patent No.: US 11,335,623 B2
(45) Date of Patent: May 17, 2022

(54) METHOD OF PRODUCING HEAT-DISSIPATING UNIT

(71) Applicant: SHOWA DENKO K.K., Tokyo (JP)

(72) Inventors: Shinobu Tamura, Oyama (JP); Takayuki Matsuzawa, Oyama (JP)

(73) Assignee: SHOWA DENKO K.K., Tokyo (JP)

( * ) Notice: Subject to any disclaimer, the term of this patent is extended or adjusted under 35 U.S.C. 154(b) by 676 days.

(21) Appl. No.: 16/338,697

(22) PCT Filed: Sep. 11, 2017

(86) PCT No.: PCT/JP2017/032648
§ 371 (c)(1),
(2) Date: Apr. 2, 2019

(87) PCT Pub. No.: WO2018/066311
PCT Pub. Date: Apr. 12, 2018

(65) Prior Publication Data
US 2019/0221501 A1     Jul. 18, 2019

(30) Foreign Application Priority Data

Oct. 7, 2016 (JP) .............................. JP2016-199003

(51) Int. Cl.
*B21D 53/02* (2006.01)
*H01L 21/48* (2006.01)
(Continued)

(52) U.S. Cl.
CPC ............ *H01L 23/473* (2013.01); *B21D 53/02* (2013.01); *B21D 53/022* (2013.01); *B23P 15/26* (2013.01);
(Continued)

(58) Field of Classification Search
CPC ....... B21D 53/02; B21D 53/022; B23P 15/26; Y10T 29/49353
See application file for complete search history.

(56) References Cited

U.S. PATENT DOCUMENTS

| | | | |
|---|---|---|---|
| 4,074,342 A * | 2/1978 | Honn | H01L 25/0652 361/779 |
| 6,807,059 B1 * | 10/2004 | Dale | F28F 3/022 257/722 |

(Continued)

FOREIGN PATENT DOCUMENTS

| | | |
|---|---|---|
| JP | 10-321774 | 12/1998 |
| JP | 2005-024107 | 1/2005 |

(Continued)

OTHER PUBLICATIONS

International Search Report for corresponding International Application No. PCT/JP2017/032648, dated Nov. 21, 2017.

(Continued)

*Primary Examiner* — Sarang Afzali
(74) *Attorney, Agent, or Firm* — Mori & Ward, LLP

(57) ABSTRACT

[Purpose] To provide is a method capable of producing a heat-dissipating unit easily and at low cost.
[Solution] The method of producing a heat-dissipating unit 12 includes: inserting pins 17 punched out of a second plate member 22 for pins into a plurality of through-holes 16 formed in a first plate member 20 for a substrate. In the first plate member 20, a plurality of substrate forming portions 25 is provided side by side in the longitudinal direction of the first plate member 20. In the second plate member 22, a plurality of pin punch-out portions 26 is provided side by side in the longitudinal direction of the second plate member 22. The method includes: a step A of forming the through-holes 16 in the substrate forming portion 25 of the first plate member 20; a step B of subjecting the pin punch-out portion (Continued)

26 of the second plate member 22 to a half-punch out process to form half-punched-out pin forming portions 27 protruding from one surface side of the second plate member 22; a step C of forming the pins 17 by punching out the pin forming portions 27 from the second plate member 22 and simultaneously inserting the pins 17 into the through-holes 16 in the first plate member 20; and a step D of forming a substrate by cutting the substrate forming portion 25 with the pins 17 inserted in the through-holes 16 from the first plate member 20.

14 Claims, 6 Drawing Sheets

(51) Int. Cl.
*H01L 23/473* (2006.01)
*H05K 7/20* (2006.01)
*H02M 7/48* (2007.01)
*B23P 15/26* (2006.01)
*F28D 21/00* (2006.01)

(52) U.S. Cl.
CPC .......... *H01L 21/4882* (2013.01); *H02M 7/48* (2013.01); *H05K 7/20254* (2013.01); *H05K 7/20927* (2013.01); *F28D 2021/0028* (2013.01); *Y10T 29/49353* (2015.01); *Y10T 29/49798* (2015.01); *Y10T 29/49945* (2015.01)

(56) References Cited

U.S. PATENT DOCUMENTS

| | | | |
|---|---|---|---|
| 9,437,797 B2* | 9/2016 | Matsumoto | H01L 23/40 |
| 9,845,999 B2* | 12/2017 | Matsushima | B23P 11/00 |
| 10,101,097 B2* | 10/2018 | Remsburg | H01L 23/3677 |
| 10,222,125 B2* | 3/2019 | Coteus | H01L 21/4882 |
| 10,328,482 B2* | 6/2019 | Hirata | B21D 53/04 |
| 2013/0180688 A1* | 7/2013 | Lin | B22D 19/0081 |
| | | | 164/112 |
| 2014/0054023 A1* | 2/2014 | Kokubo | H01L 23/3677 |
| | | | 72/352 |
| 2018/0266773 A1* | 9/2018 | Hislop | F28D 15/04 |

FOREIGN PATENT DOCUMENTS

| | | |
|---|---|---|
| JP | 2009-064908 | 3/2009 |
| JP | 2013-123038 | 6/2013 |
| JP | 2013-239676 | 11/2013 |

OTHER PUBLICATIONS

Written Opinion for corresponding International Application No. PCT/JP2017/032648, dated Nov. 21, 2017.

* cited by examiner

METHOD OF PRODUCING HEAT-DISSIPATING UNIT

FIELD OF THE INVENTION

The present invention relates to a method of producing a heat-dissipating unit used in a cooling apparatus for cooling a heating element composed of electronic components such as a semiconductor element.

Note that in this specification and claims, upper and lower sides of FIG. 6 and FIGS. 7A, 7B, and 7C will be referred to as "upper" and "lower" sides.

BACKGROUND ART

For example, as a liquid cooling type cooling apparatus for cooling a power device (semiconductor element), such as, e.g., an IGBT (Insulated Gate Bipolar Transistor), for use in a power conversion device mounted on an electric vehicle, a hybrid vehicle, a train, etc., the present applicant proposed the following cooling device (see Patent Document 1). The cooling device is provided with a casing having a top wall and a bottom wall and having a cooling fluid passage therein and a heat radiator arranged in the cooling fluid passage in the casing. The heat radiator is configured by a single heat-dissipating unit. The heat-dissipating unit is composed of a substrate having a plurality of through-holes formed therein and pins fixed to the substrate in a state in which the pins are inserted in the through-holes of the substrate with both longitudinal end portions of the pin protruded from the through-hole by the certain length, and the portion of the pin protruding from the through-hole serves as a fin.

The heat-dissipating unit of the cooling apparatus described in Patent Document 1 is produced as follow. That is, a substrate in which a plurality of fin-insertion through-holes are formed and pins integrally provided with a plurality of protrusions outwardly protruding from the outer peripheral surface at the middle part of the outer peripheral surface in the longitudinal direction are prepared. The size of the virtual shape drawn by connecting protruding ends of the plurality of protrusions of the pin is made larger than the through-hole of the substrate. The pin is press-fitted into the through-hole of the substrate to thereby plastically deform at least the protrusion of the pin among the protrusion of the pin and the peripheral portion of the through-hole of the substrate to fix the pin to the substrate.

The heat-dissipating unit of the cooling apparatus described in Patent Document 1 is produced as follow. That is, a substrate in which a plurality of fin-insertion through-holes are formed and pins integrally provided with a plurality of protrusions outwardly protruding from the outer peripheral surface at the middle part of the outer peripheral surface in the longitudinal direction are prepared. The size of the virtual shape drawn by connecting protruding ends of the plurality of protrusions of the pin is made larger than the through-hole of the substrate. The pin is press-fitted into the through-hole of the substrate to thereby plastically deform at least the protrusion of the pin among the protrusion of the pin and the peripheral portion of the through-hole of the substrate to fix the pin to the substrate.

However, in the above-described method of producing a heat-dissipating unit, the work of producing the pin is troublesome and the cost increases. Moreover, it is troublesome to press-fit the plurality of pins integrally provided with a plurality of protrusions on the outer peripheral surface into the through-holes of the substrate. Thus, the heat-dissipating unit cannot be produced simply and at low cost.

PRIOR ART DOCUMENT

Patent Document

Patent Document 1: Japanese Unexamined Patent Application Publication No. 2013-123038

SUMMARY OF THE INVENTION

Problems to be Solved by the Invention

An object of the present invention is to solve the above-described problems and to provide a method capable of producing a heat-dissipating unit easily and at low cost.

Means for Solving the Problems

The present invention has the following aspects in order to achieve the above-described object.

1) A method of producing a heat-dissipating unit, wherein the heat-dissipating unit comprises a substrate having a plurality of through-holes formed therein and a plurality of pins fixed to the substrate in a state in which the pins are inserted in the through-holes of the substrate with both longitudinal end portions of the pin protruded from the through-hole by a certain length, and portions of the pins protruding from the through-holes serve as fins, the method comprising:

inserting the plurality of pins into the plurality of through-holes formed in a first plate member for the substrate, wherein the plurality of pins are simultaneously punched out of a second plate member for the pin.

2) The method of producing a heat-dissipating unit as recited in the aforementioned Item 1), further comprising:

preparing a substrate having a required number of through-holes using the first plate member; and inserting the pins into the through-holes of the substrate.

3) The method of producing a heat-dissipating unit as recited in the aforementioned Item 1), further comprising:

forming a certain number of the through-holes required for a single substrate in a substrate forming portion located at one end portion of the first plate member in which a plurality of substrate forming portions each having a size for forming one substrate is provided side by side in a longitudinal direction of the first plate member;

thereafter inserting the pins into the through-holes of the substrate forming portion; and subsequently cutting the substrate forming portion in which the pins are inserted into the through-holes from the first plate member to produce a substrate.

4) The method of producing a heat-dissipating unit as recited in the aforementioned Item 3), further comprising:

forming a plurality of half-punched-out pin forming portions protruding on one surface side of the second plate member in a pin punch-out portion located at one end portion of the second plate member in which the plurality of pin punch-out portions, each from which a certain number of pins required for one substrate are punched out, are provided side by side in a longitudinal direction of the second plate member; and punching the plurality of half-punched-out pin forming portions of the pin punch-out portion from the second plate member to produce the plurality of pins and simultaneously inserting the plurality of pins into the through-holes of the substrate forming portion located at the one end portion of the first plate member.

5) The method of producing a heat-dissipating unit as recited in the aforementioned Item 4), further comprising:

performing a Step A of forming the through-holes in the substrate forming portion of the first plate member, a Step B of subjecting the pin punch-out portion of the second plate member to a half-punch-out process to form a half-punched-out pin forming portion protruding on one surface side of the second plate member; a Step C of punching the pin forming portion from the second plate member to form the pins and simultaneously inserting the pins into the through-holes of the substrate forming portion of the one end portion of the first plate member; and a Step D of cutting the substrate forming portion in which the pins are inserted into the through-holes from the first plate member to produce the substrate by a single die.

6) The method of producing a heat-dissipating unit as recited in the aforementioned Item 5), further comprising:

performing a Step E of cutting the pin punch-out portion from the second plate member after forming the plurality of pins from the pin punch-out portion located at one end portion of the second plate member, wherein the Step E is performed by the die for performing the Steps A to D.

7) The method of producing a heat-dissipating unit as recited in the aforementioned Item 6), further comprising:

arranging a first coil in which the first plate member is wound and a second coil in which the second plate member is wound so that feeding directions of both the plate members from both the coils are orthogonal as seen from a plane; and performing the Steps A to E while intermittently feeding the first plate member from the first coil and intermittently feeding the second plate member from the second coil.

8) The method of producing a heat-dissipating unit as recited in the aforementioned Item 1), wherein the second plate member is made of JIS A1000 series aluminum.

9) The method of producing a heat-dissipating unit as recited in the aforementioned Item 1), wherein the second plate member is made of JIS A6000 series aluminum.

10) The method of producing a heat-dissipating unit as recited in the aforementioned Item 1), wherein when the pins are inserted into the through-holes of the first plate member, the pins are press-fitted therein.

11) The method of producing a heat-dissipating unit as recited in the aforementioned Item 1), wherein a brazing material layer is provided on at least one surface of the first plate member.

12) The method of producing a heat-dissipating unit as recited in the aforementioned Item 1), wherein a brazing material layer is provided on at least one surface of the second plate member.

13) The method of producing a heat-dissipating unit as recited in the aforementioned Item 1), wherein a cross-sectional shape of the pin to be punched is circular, and a ratio L/D of a length L of the pin to a diameter D is 1.7 or less.

14) The method of producing a heat-dissipating unit as recited in the aforementioned Item 1), wherein a shape of the through-hole of the first plate member is a streamline shape, and a cross-sectional shape of the pin is a streamline shape having an arc edge and a pointed edge oriented in a same direction as an arc edge and a pointed edge of the through-hole, respectively.

Effects of the Invention

According to the methods as recited in the aforementioned Items 1) to 14), the methods include: inserting the plurality of pins into the plurality of through-holes formed in the first plate member for a substrate, wherein the plurality of pins are simultaneously punched out of the second plate member for pins. Therefore, the plurality of pins can be made at once, making it easier to produce the plurality of pins, which in turn makes it possible to produce the heat-dissipating unit easily and at low cost.

According to the method as recited in the aforementioned Item 4), in the method recited in the aforementioned Item 3) which includes: forming a certain number of through-holes required for one substrate in a substrate forming portion located at one end portion of the first plate member in which a plurality of the substrate forming portions having a size for forming one substrate are provided side by side in the longitudinal direction of the first plate member; inserting pins into the through-holes of the substrate forming portion; and then cutting the substrate forming portion in which the pins are inserted into the through-holes from the first plate member to forma substrate, the method as recited in the aforementioned Item 4), further includes:

forming a plurality of half-punched-out pin forming portions protruding on one surface side of the second plate member in a pin punch-out portion located at one end portion of the second plate member in which the plurality of pin punch-out portions portion of which a certain number of pins required for one substrate are punched out are provided side by side in a longitudinal direction of the second plate member; and punching the plurality of half-punched-out pin forming portions of the pin punch-out portion from the second plate member to produce the plurality of pins and simultaneously inserting the plurality of pins into the through-holes of the substrate forming portion located at the one end portion of the first plate member.

Therefore, it is possible to punch out the plurality of pins from the pin punch-out portion of the second plate member and simultaneously insert the punched pins into the plurality of through-holes of the substrate forming portion of the first plate member. Thereafter, the substrate forming portion in which the pins are inserted is cut from the first plate member to thereby form the substrate. With this, it is possible to produce a heat-dissipating unit simply and at low cost, wherein the heat-dissipating unit includes a substrate having a plurality of through-holes formed therein and pins fixed to the substrate in a state in which the pins are inserted in the through-holes of the substrate with both longitudinal end portions of the pin protruded from the through-hole by the certain length. Further, in the state in which the plurality of pin forming portions are formed so as to protrude on one surface side of the second plate member by subjecting the pin punch-out portion of the second plate member located at one end portion thereof to a half-punch-out process, the pin forming portions can be adjusted to the positions of the through-holes of the substrate forming portion of the first plate member. For this reason, it is possible to align all of the pin forming portions and all of the through-holes, which makes it possible to accurately insert the punched pins into the through-holes.

According to the methods as recited in the aforementioned Items 5) and 6), it is possible to shorten the time required for producing the heat-dissipating unit.

According to the method as recited in the aforementioned Item 7), the heat-dissipating unit can be produced continuously and efficiently.

According to the heat-dissipating unit produced by the method as recited in the aforementioned Item 8), the heat conductivity of the fin becomes excellent.

According to the heat-dissipating unit produced by the method as recited in the aforementioned Item 9), the heat conductivity of the fin becomes excellent. Further, the load resistance of the pin in the longitudinal direction thereof is improved.

According to the method as recited in the aforementioned Item 10), the heat transfer performance between the substrate and the fin in the produced heat-dissipating unit is improved.

In cases where the heat-dissipating unit produced by the method as recited in the aforementioned Item 11) is used for configuring a heat radiator in a cooling apparatus equipped with a casing having a top wall and a bottom wall and provided with a cooling fluid passage inside and a heat radiator having at least one heat-dissipating unit arranged in the cooling fluid passage in the casing, the following effects are obtained. That is, a casing is generally produced by brazing two or more constituent elements, but simultaneously with the brazing of the constituent elements, the substrate composed of the first plate member and the pin forming the fin are brazed together, which improves the heat transfer performance between the substrate and the fin.

In cases where the heat-dissipating unit produced by the method as recited in the aforementioned Item 12) is used for configuring a heat radiator in a cooling apparatus equipped with a casing having a top wall and a bottom wall and provided with a cooling fluid passage inside and a heat radiator having at least one heat-dissipating unit arranged in the cooling fluid passage in the casing, the following effects are obtained. That is, a casing is usually produced by brazing two or more constituent elements. However, in cases where the heat radiator consists of one heat-dissipating unit, simultaneously with the brazing of the constituent elements, at least one end portion of the pin of the heat-dissipating unit can be brazed to the top wall or the bottom wall of the casing. Further, in cases where the heat radiator is provided with a plurality of heat-dissipating units arranged in a stacked manner in the vertical direction and an intermediate plate arranged between adjacent heat-dissipating units, at least one end portion of the pin of the heat-dissipating unit can be brazed to the top wall or the bottom wall of the casing or the intermediate plate. Therefore, it becomes unnecessary to separately use a member having a brazing material for brazing. In addition, the pressure resistance of the cooling apparatus improves by performing the aforementioned brazing.

According to the method as recited in the aforementioned Item 13), the pins can be punched out of the second plate member with high precision, so the number of pins to be fixed to one substrate can be relatively increased, which improves the heat transfer performance between the fins and the substrate.

In cases where the heat-dissipating unit produced by the method as recited in the aforementioned Item 14) is used for configuring a heat radiator in a cooling apparatus equipped with a casing having a top wall and a bottom wall and provided with a cooling fluid passage inside and a heat radiator having at least one heat-dissipating unit arranged in the cooling fluid passage in the casing, it is possible to reduce the resistance to the cooling fluid flowing through the cooling fluid passage in the casing.

Figure 1:
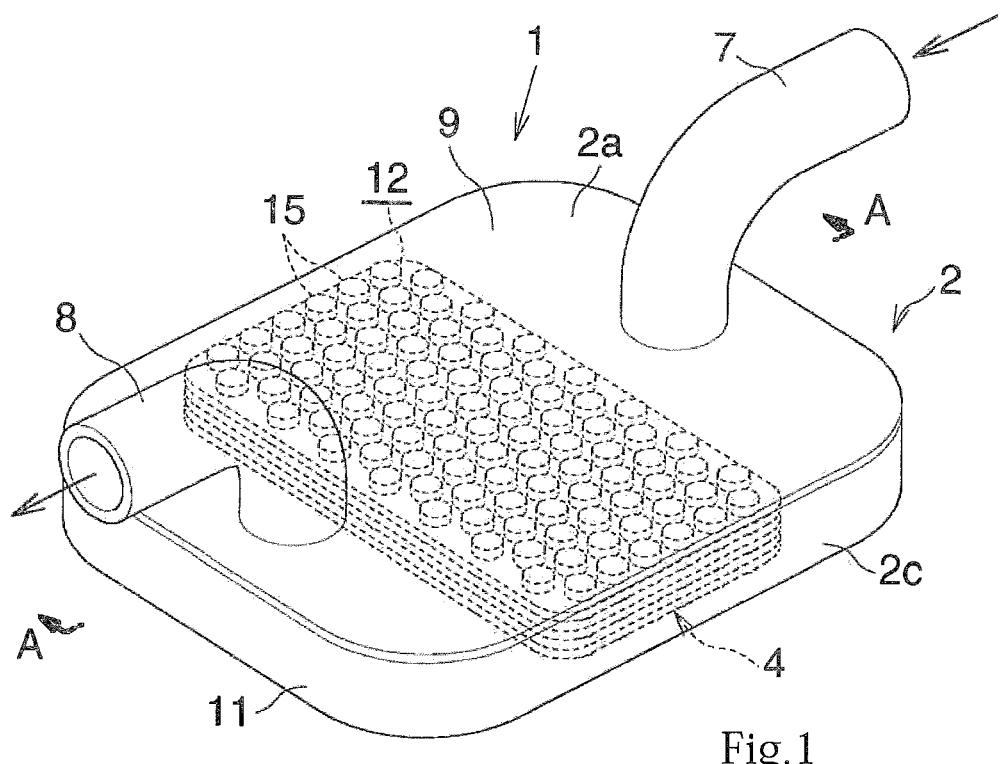
FIG. 1 is a perspective view showing the overall configuration of a cooling apparatus provided with a heat radiator composed of a heat-dissipating unit produced by the method of the present invention.

DESCRIPTION OF REFERENCE SYMBOLS 12, 30, 35, 40, 45: heat-dissipating unit
14: substrate
15: fin
16: through-hole
17: pin
20: first plate member
21: first coil
22: second plate member
23: second coil
24: die
25: substrate forming portion
26: pin punch-out portion
27: pin forming portion
31, 36: brazing material layer of the substrate
41: brazing material layer of the pin
46: through-hole
47: pin

EMBODIMENT FOR CARRYING OUT THE INVENTION

Hereinafter, some embodiments of the present invention will be described with reference to the drawings. This embodiment is directed to a heat-dissipating unit used in a liquid-cooling type cooling apparatus by the method of the present invention.

Note that in this specification, the term "aluminum" is used to include the meaning of an aluminum alloy in addition to pure aluminum.

Note that in the following description on the cooling apparatus, the upper, lower, left, and right sides in FIG. 2 will be referred to as the upper, lower, left, and right side, respectively.

Further note that the same symbols are allotted to the same items and the same portions throughout the drawings.

Figure 2:
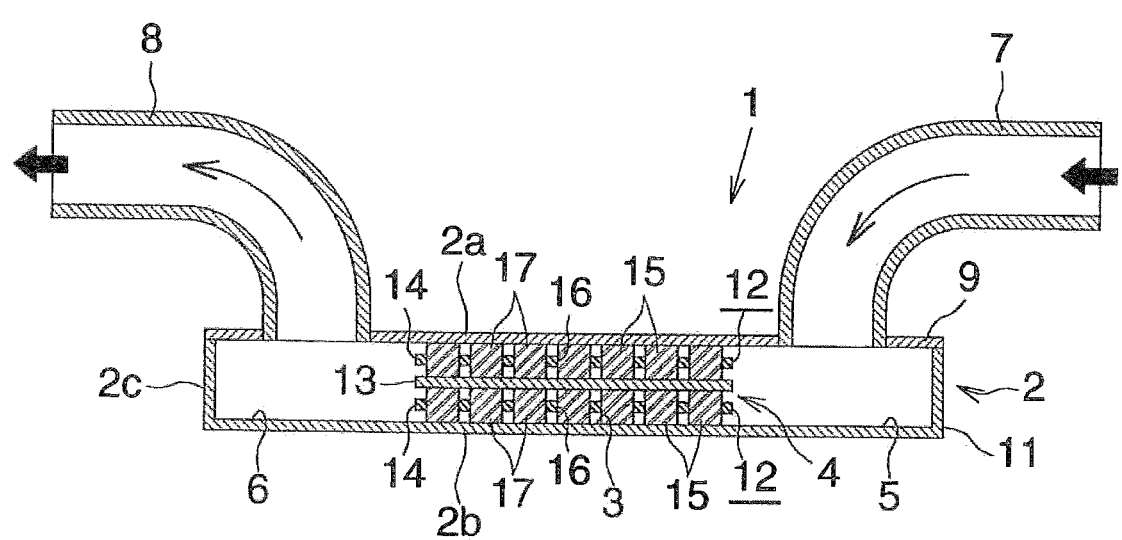
FIG. 2 is a cross-sectional view taken along the line A-A in FIG. 1.
Figure 3:
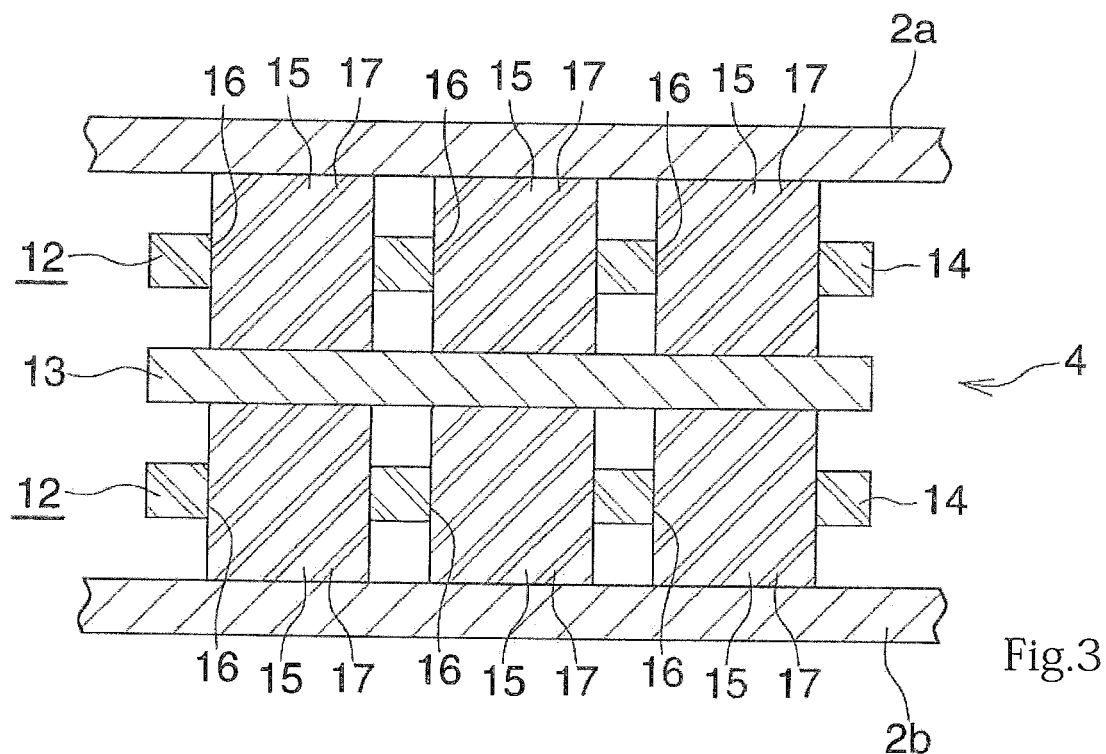
FIG. 3 is a partially enlarged view of FIG. 2.
Figure 4:
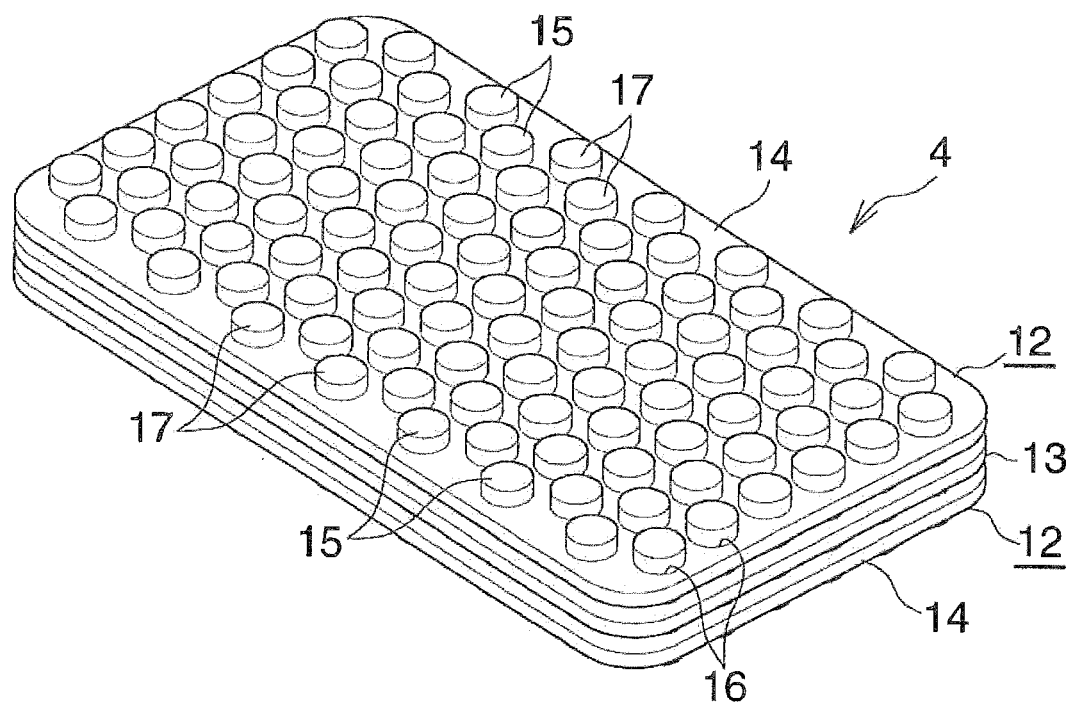
FIG. 4 is a perspective view showing the overall configuration of the heat radiator for use in the cooling apparatus shown in FIG. 1

FIG. 1 and FIG. 2 show an overall structure of a cooling apparatus having a heat-dissipating unit produced by the method of the present invention, and FIG. 3 shows the structure of the main part thereof. FIG. 4 shows a heat radiator used in the cooling apparatus of FIG. 1. Further, FIG. 5 to FIG. 8 show a method of producing a heat-dissipating unit according to the present invention.

In FIG. 1 and FIG. 2, the liquid-cooling type cooling apparatus 1 is provided with a hollow casing 2 having a top wall 2a, a bottom wall 2b, and a peripheral wall 2c and provided with a cooling fluid passage 3 therein, and a heat radiator 4 arranged in the cooling fluid passage 3 in the casing 2.

At one longitudinal end portion in the casing 2 (at the right end portion in this embodiment), an inlet header 5 into which a cooling fluid flows from the outside is provided, while at the other longitudinal end portion in the casing 2 (at the left end portion in this embodiment), an outlet header 6 from which the cooling fluid flows to the outside is provided. Thus, the cooling fluid passage 3 is configured to flow the cooling fluid flowed into the inlet header 5 to the outlet header 6. To the top wall 2a of the casing 2, an aluminum inlet pipe 7 for supplying a cooling fluid to the inlet header 5 in the casing 2 and an aluminum outlet pipe 8 for discharging the cooling fluid from the outlet header 6 in the casing 2 are connected. Further, it is configured such that on at least one of the outer surface of the top wall 2a and the outer surface of the bottom wall 2b of the casing 2 (the outer surface of the top wall 2a in this embodiment), a heating element (not shown), such as, e.g., a power device such as an IGBT, an IGBT modules integrated with a control circuit and housed in the same package, an intelligent power module in which a protection circuit is further integrated with the IGBT module and housed in the same package, is attached.

The casing 2 is composed of a plate-shaped aluminum upper constituent element 9 forming the top wall 2a and an upwardly opened box-like aluminum lower constituent element 11 forming a bottom wall 2b and a peripheral wall 2c. The lower surface peripheral edge portion of the upper constituent element 9 is joined with a brazing material (hereinafter referred to as "brazed") to the upper end portion of the portion forming the peripheral wall 2c of the lower constituent element 11.

As shown in FIG. 2 to FIG. 4, the heat radiator 4 is provided with a plurality of heat-dissipating units 12 (two heat-dissipating units 12 in this embodiment), arranged in a stacked manner in the vertical direction and an aluminum intermediate plate 13 arranged between adjacent heat-dissipating units 12. The heat-dissipating unit 12 is composed of a horizontal aluminum substrate 14 and a plurality of aluminum fins 15 provided on both surfaces of the substrate 14 so as to protrude from the substrate 14 with its longitudinal direction oriented in the vertical direction. A plurality of circular through-holes 16 is formed in the substrate 14, and an aluminum round bar-shaped pins 17 are inserted in the circular through-holes 16 and secured to the substrate 14 with the longitudinal central portion positioned in the circular through-hole 16. The portions of the pin 17 protruding upward and downward from the circular through-hole 16 serve as both the upper and lower fins 15. The substrate 14 is made of, for example, JIS A3000 series aluminum, JIS A1000 series aluminum, or JIS A6000 series aluminum, and the pin 17 is made of, for example, JIS A1000 series aluminum or JIS A6000 series aluminum. Securing of the pin 17 to the substrate 14 is performed by press-fitting into the circular through-hole 16 or brazing.

The tip of the upper fin 15 of the upper heat-dissipating unit 12 is in thermal contact with the inner surface of the top wall 2a of the casing 2. In the same manner, the tip of the lower fin 15 is in thermal contact with the upper surface of the intermediate plate 13. Further, the tip of the lower fin 15 of the lower heat-dissipating unit 12 is in thermal contact with the inner surface of the bottom wall 2b of the casing 2. In the same manner, the tip of the upper fin 15 is in thermal contact with the lower surface of the intermediate plate 13. In this way, the substrates 14 of both the heat-dissipating units 12 and the intermediate plate 13 are vertically spaced apart. The cross-sectional shapes of both the upper and lower fins 15 of both the heat-dissipating units 12 arranged adjacently in the vertical direction are each a circular shape of the equal size, and all of the upper and lower fins 15 of both the heat-dissipating units 12 arranged adjacently in the vertical direction are overlapped at least partly (entirely in this embodiment) as viewed from a plane.

The cooling apparatus 1 is produced by the method including: arranging two heat-dissipating units 12 in the lower constituent element 11 in a state of being stacked via the intermediate plate 13; placing the upper constituent element 9 thereon; and brazing both the upper and lower constituent elements 9 and 11. In the production method, in cases where the tip of the upper fin 15 of the upper heat-dissipating unit 12 is brazed to the inner surface of the top wall 2a of the casing 2 and the tip of the lower fin 15 is brazed to the upper surface of the intermediate plate 13, or in cases where the tip of the lower fin 15 of the lower heat-dissipating unit 12 is brazed to the inner surface of the bottom wall 2b of the casing 2 and the tip of the upper fin 15 is brazed to the lower surface of the intermediate plate 13, a separately prepared sheet-like brazing material is used.

In the cooling apparatus 1 described above, the cooling fluid flowed into the inlet header 5 of the casing 2 through the inlet pipe 7 enters the cooling fluid passage 3, flows between the fins 15 in between the substrates 14 of both the upper and lower heat-dissipating units 12 and the top wall 2a and the bottom wall 2b of the casing 2 and in between the substrate 14 of each heat-dissipating unit 12 and the intermediate plate 13, enters the outlet header 6, and then is discharged from the outlet header 6 through the outlet pipe 8. The heat emitted from the heating element attached to the outer surface of the top wall 2a of the casing 2 is transmitted to the top wall 2a, and then transmitted to the substrates 14 and both the upper and lower fins 15 of both the heat-dissipating units 12, and then transmitted from the intermediate plate 13 to the cooling fluid flowing in the cooling fluid passage 3. Thus, the heating element is cooled.

The heat transfer path of the heat emitted from the heating element and transferred to the top wall 2a of the casing 2 to the cooling fluid flowing in the cooling fluid passage 3 is as follows. The first path that transmits the heat emitted from the heating element attached to the outer surface of the top wall 2a of the casing 2 to the cooling fluid is a path through which the heat is transmitted directly from the top wall 2a to the cooling fluid. The second path is a path through which the heat is transmitted from the top wall 2a to both the upper and lower fins 15 of the upper heat-dissipating unit 12 and then transmitted from both the upper and lower fins 15 to the cooling fluid. The third path is a path through which the heat is transmitted from the top wall 2a to the substrate 14 via the upper fin 15 of the upper heat-dissipating unit 12 and then transmitted from the substrate 14 to the cooling fluid. The fourth path is a path through which the heat is transmitted from the top wall 2a to the intermediate plate 13 via both the upper and lower fins 15 of the upper heat-dissipating unit 12 and then transmitted from the intermediate plate 13 to the cooling fluid. The fifth path is a path through which the heat is transmitted from the top wall 2a to the upper and lower fins 15 of the lower heat-dissipating unit 12 via both the upper and lower fins 15 of the upper heat-dissipating unit 12 and the intermediate plate 13 and then transmitted from both the upper and lower fins 15 to the cooling fluid. The sixth path is a path through which the heat is transmitted from the top wall 2a to the upper fin 15 of the lower heat-dissipating unit 12 via both the upper and lower fins 15 of the upper heat-dissipating unit 12 and the intermediate plate 13 and further transmitted to the substrate 14 via the upper fin 15 and from the substrate 14 to the cooling fluid.

In the cooling apparatus 1 described above, the heat radiator 4 is composed of two heat-dissipating units 12, but the heat radiator may be composed of three or more heat-dissipating units 12 and an intermediate plate 13 arranged between adjacent heat-dissipating units 12.

Next, with reference to FIG. 5 to FIG. 8, a method of producing the heat-dissipating unit 12 used in the heat radiator 4 of the cooling apparatus 1 of FIG. 1 will be described. The method shown in FIG. 5 to FIG. 8 is directed to a method of producing a heat-dissipating unit of a type in which the pins 17 are press-fitted into the through-holes 16 of the substrate 14.

Figure 5:
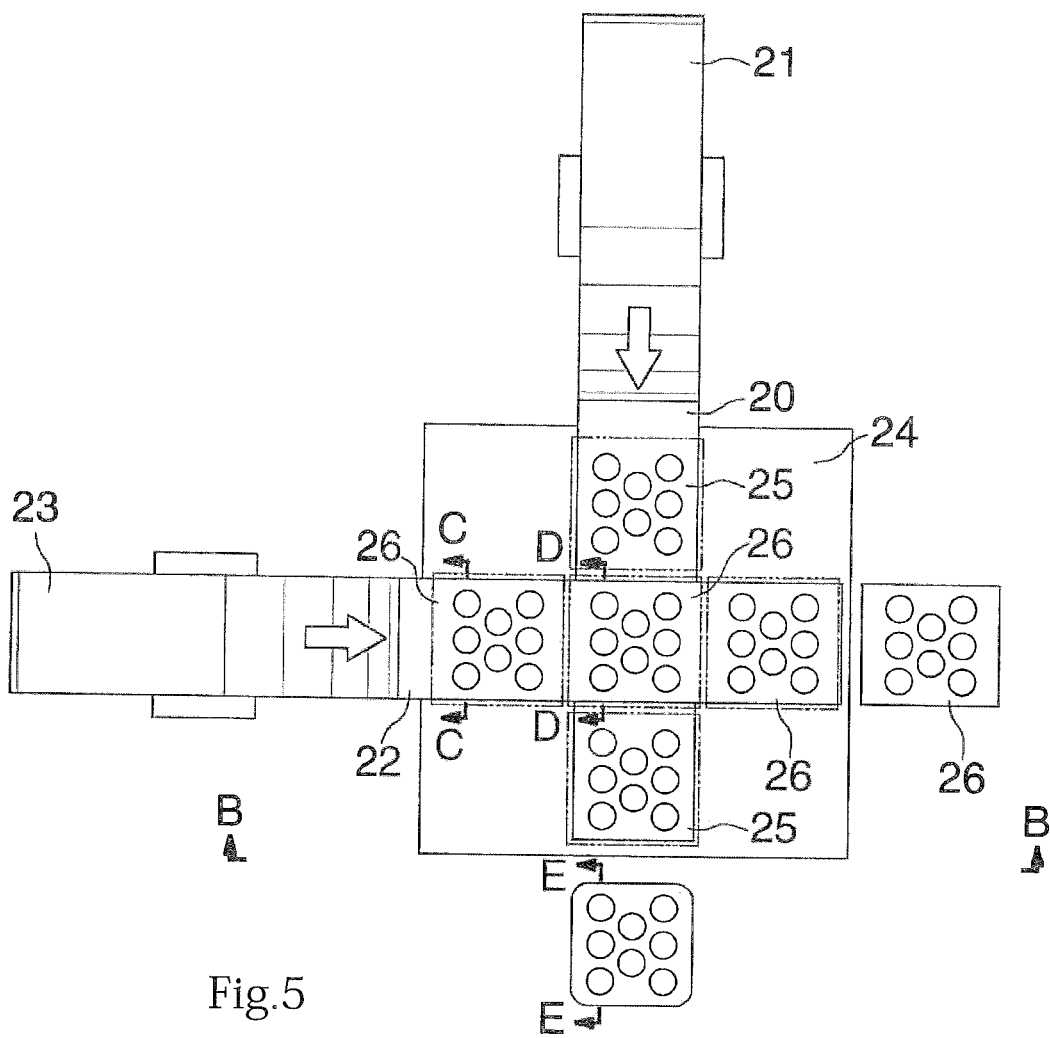
FIG. 5 is a plan view schematically showing a method of producing a heat-dissipating unit according to the present invention.
Figure 6:
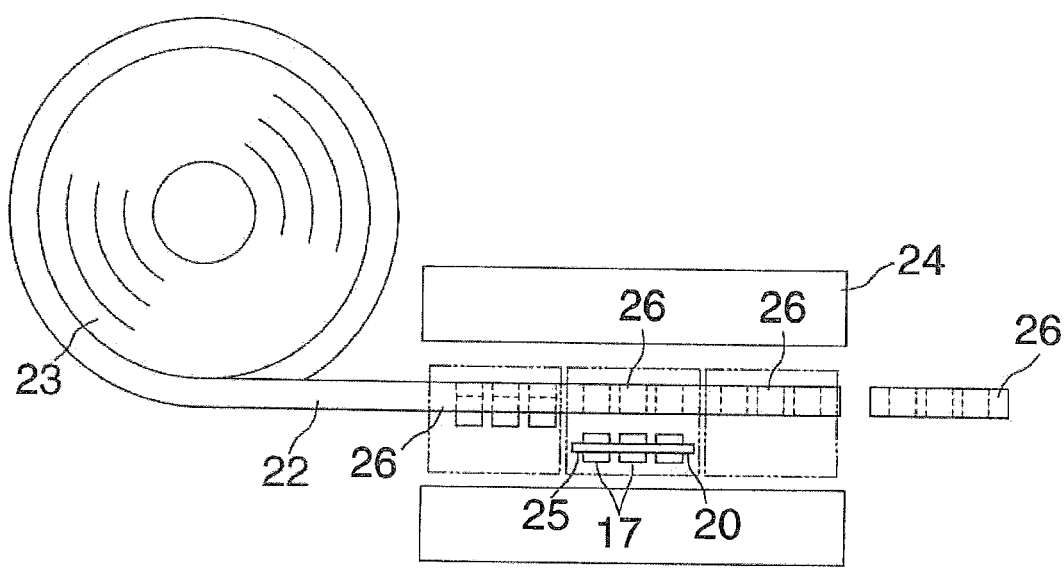
FIG. 6 is a view taken along the line B-B in FIG. 5.

In the following description, the left and right sides of FIG. 5 will be referred to as left and right sides, respectively, and the lower side of FIG. 5 will be referred to as a front side.

As shown in FIG. 5 to FIG. 8, for example, a first coil 21 in which the first plate member 20 for the substrate 14 made of JIS A3000 series aluminum is wound, a second coil 23 in which the second plate member 22 for the pin 17 made of JIS A1000 series aluminum or JIS A6000 series aluminum is wound, and a die 24 for performing various processing on the first plate member 20 fed from the first coil 21 and the second plate member 22 fed from the second coil 23 are prepared. The second coil 23 is arranged on the left front side of the first coil 21, and the die 24 is arranged on the front side of the first coil 21 and on the right side of the second coil 23.

In the first plate member 20 wound on the first coil 21, a plurality of substrate forming portions 25 each having a size for forming one substrate 14 is provided side by side in the longitudinal direction of the first plate member 20. In the second plate member 22 wound on the second coil 23, a plurality of pin punch-out portions 26 each having the same size as the substrate forming portion 25 of the first plate member 20 for punching a required number of pins 17 for one substrate 14 is provided side by side in the longitudinal direction of the second plate member 22.

The first coil 21 is configured to intermittently feed the first plate member 20 toward the die 24 by the length of one substrate forming portion 25. The second coil 23 is configured to feed the second plate member 22 to the right side toward the die 24 by the length of one pin punch-out portion 26. It is configured such that the first plate member 20 fed from the first coil 21 comes to the underside of the second plate member 22 fed out from the second coil 23, and the feeding directions of both the plate members 20 and 22 are orthogonal as viewed from a plane.

The die 24 is provided with a punching portion for forming the through-holes 16 by punching the substrate forming portion 25 of the first plate member 20, a half-punching portion for forming a plurality of pin forming portions 27 (see FIG. 7A) protruding toward the lower surface side of the second plate member 22 by subjecting the pin punch-out portion 26 of the second plate member 22 to half-punching processing, a pin inserting portion for forming pins 17 by punching the pin forming portion 27 from the second plate member 22 and simultaneously inserting the pins 17 into the through-holes 16 of the substrate forming portion 25 of the one end portion of the first plate member 20, a cutting portion for cutting the substrate forming portion 25 having the pins 17 inserted into the through-holes 16 from the first plate member 20 to form the substrate 14, and a scrapping portion for cutting the pin punch-out portion 26 after forming the plurality of pins 17 from the pin punch-out portion 26 located at one end of the second plate member 22 from the second plate member 22.

Figure 8:
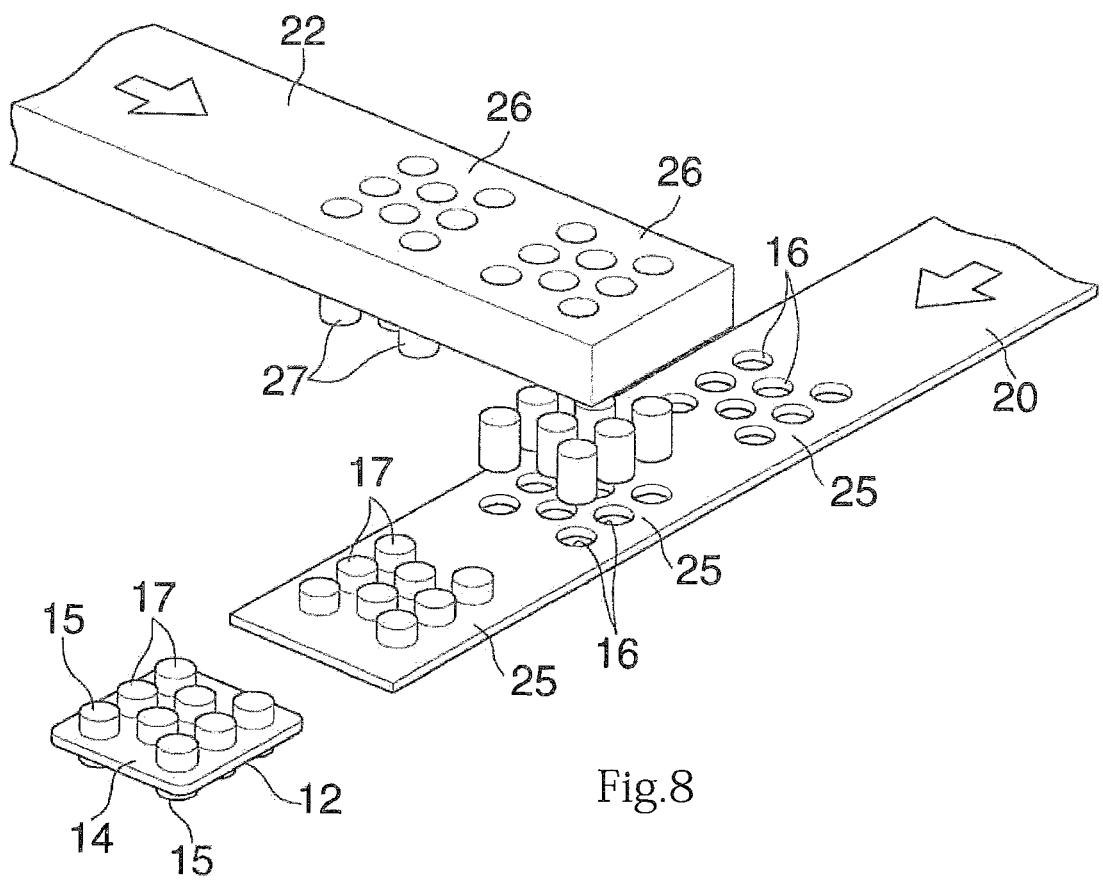
FIG. 8 is a perspective view schematically showing a method of producing a heat-dissipating unit according to the present invention.

In producing the heat-dissipating unit 12, the substrate forming portion 25 of the tip portion is moved to the punching portion of the die 24 while intermittently feeding the first plate member 20 forward from the first coil 21 by the length of one substrate forming portion 25, and at the punching portion, the number of through-holes 16 required for one substrate 14 are simultaneously formed in the substrate forming portion 25 of the tip portion of the first plate member 20 (see Step A, and FIG. 8). Simultaneously with this, the second plate member 22 is moved to the half-punching portion of the die 24 while intermittently feeding the second plate member 22 rightward by the length of one pin punch-out portion 26 from the second coil 23, and at the half-punched portion, the pin punch-out portion 26 is subjected to half-punching to form a plurality of half-punched-out pin forming portions 27 protruding to the lower surface side of the second plate member 22 (see Step B, FIG. 7A and FIG. 8).

Next, the substrate forming portion 25 of the first plate member 20 in which the through-holes 16 are formed is moved to the pin inserting portion of the die 24, and the pin punch-out portion 26 of the second plate member 22 in which the pin forming portion 27 is formed is moved to the pin-inserting portion of the die 24. At this time, the positions of all of the pin forming portions 27 coincide with the positions of all of the through-holes 16.

Figure 7A:
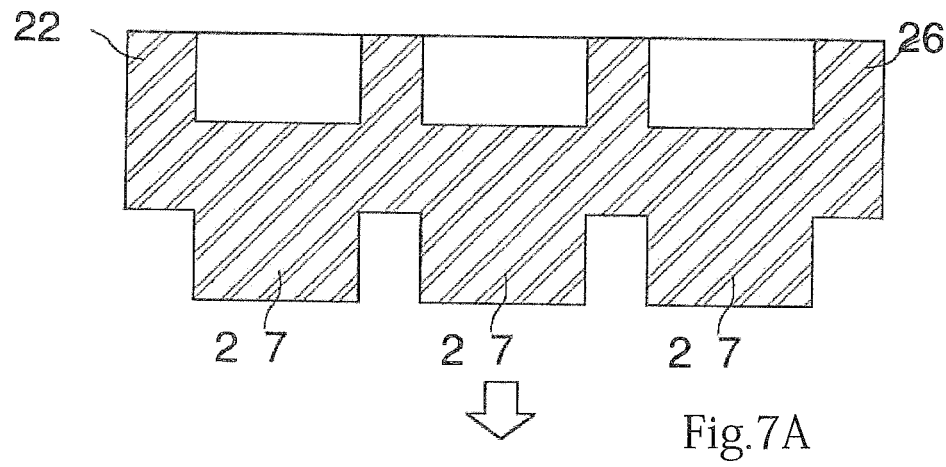
FIGS. 7A, 7B, and 7C are views showing methods of producing a heat-dissipating unit according to the present invention in the order of steps, wherein FIG. 7A corresponds to an enlarged cross-sectional view taken along the line C-C in FIG. 5, FIG. 7B corresponds to the enlarged cross-sectional view taken along the line D-D in FIG. 5, and FIG. 7C corresponds to the enlarged cross-sectional view taken along the line E-E in FIG. 5.
Figure 7B:
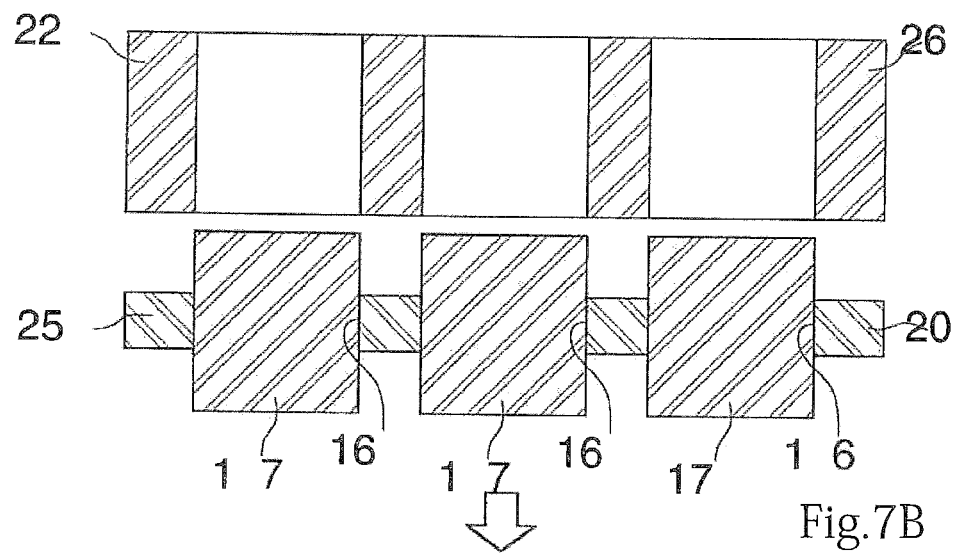
Figure 7C:
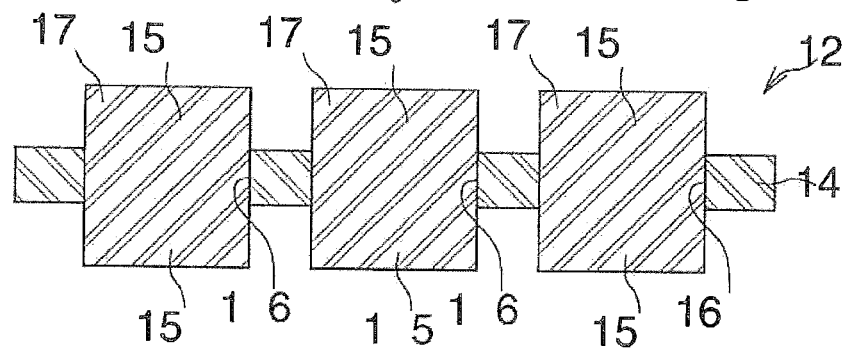

Next, in the pin inserting portion of the die 24, simultaneously with punching the pin forming portion 27 from the second plate member 22 to form a plurality of pins 17, the pins 17 are press-fitted in the through-holes 16 of the substrate forming portion 25 of the one end portion of the first plate member 20 (see Step C, FIG. 7B, and FIG. 8). Here, it is preferable that the cross-sectional shape of the pin 17 be circular and the ratio L/D of the length L of the pin 17 to the diameter D thereof be 1.7 or less. In this case, the pin 17 can be punched out with high precision, and a number of pins 17 can be fixed to one substrate 14.

Next, the substrate forming portion 25 in which the pins 17 is press-fitted in the through-holes 16 of the first plate member 20 is moved to the cutting portion of the die 24. At the cutting position, the substrate forming portion 25 in which the pins 17 are inserted in the through-holes 16 is cut from the first plate member 20 to form the substrate 14 (see Step D). Thus, the portion of the pin 17 protruding from the through-hole 16 is served as a fin 15. Thus, the heat-dissipating unit 12 is produced (see FIG. 7C and FIG. 8). On the other hand, the pin punch-out portion 26 of the second plate member 22 from which the pins 17 are punched out is moved to the scrapping portion of the die 24, and in the scrapping portion, the pin punch-out portion 26 is cut from the second plate member 22 into a scrap (Step E).

The above-described Steps A to E in the die 24 are simultaneously performed for different substrate forming portions 25 and pin punch-out portions 26.

In the above-described embodiment, the first plate member 20 fed out from the first coil 21 comes to the lower side of the second plate member 22 fed out from the second coil 23, but not limited to this. Depending on the type of the die 24, the first plate member 20 fed from the first coil 21 may be arranged above the second plate member 22 fed from the second coil 23.

FIG. 9 to FIG. 12 show modified embodiments of the heat-dissipating unit to be produced by the method of the present invention.

Figure 9:
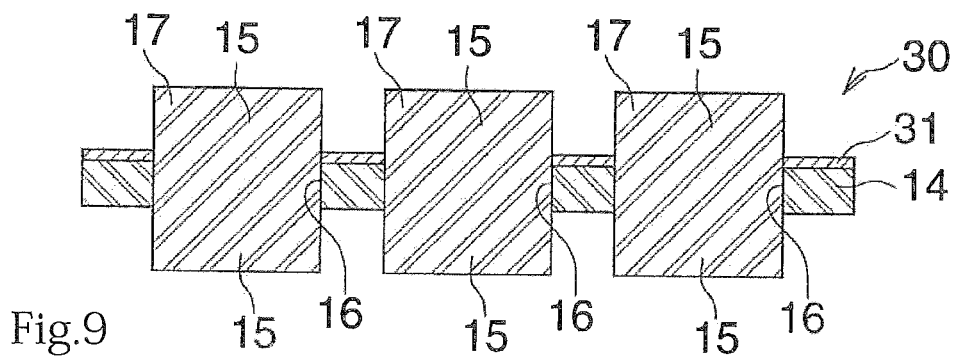
FIG. 9 is a view corresponding to FIG. 7C showing a first modified embodiment of the heat-dissipating unit to be produced by the method of the present invention.

In the case of the heat-dissipating unit 30 shown in FIG. 9, one surface (upper surface) of the substrate 14 is covered with an aluminum brazing material layer 31, and the substrate 14 is made using a first plate member 20 formed of an aluminum brazing sheet with one surface covered with an aluminum brazing material layer.

Figure 10:
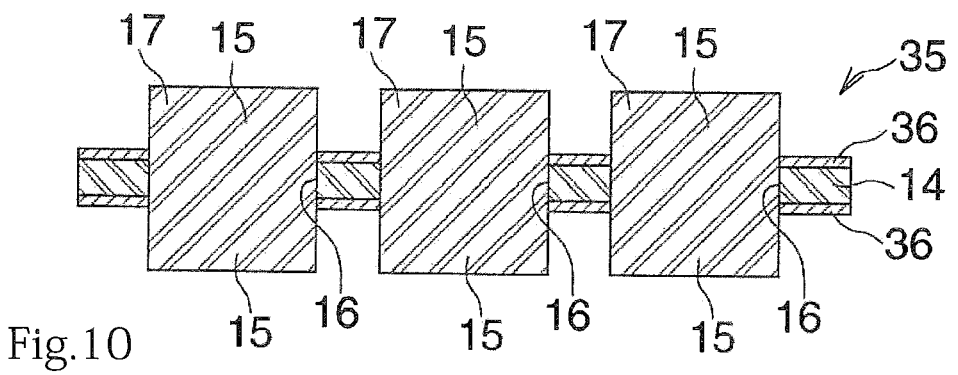
FIG. 10 is a view corresponding to FIG. 7C showing a second modified embodiment of the heat-dissipating unit to be produced by the method of the present invention.

In the case of the heat-dissipating unit 35 shown in FIG. 10, both surfaces of the substrate 14 are each covered with an aluminum brazing material layer 36, and the substrate 14 is made using a first plate member 20 formed of an aluminum brazing sheet with both surfaces each covered with an aluminum brazing material layer.

In the case of the heat-dissipating units 30 and 35 shown in FIG. 9 and FIG. 10, simultaneously with brazing the upper and lower constituent elements 9 and 11 of the casing 2 at the time of producing the above-described cooling apparatus 1, the substrate 14 and the pins 17 are brazed.

Figure 11:
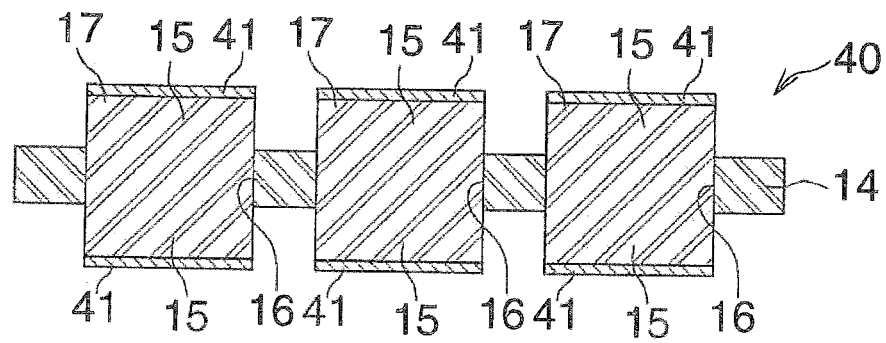
FIG. 11 is a view corresponding to FIG. 7C showing a third modified embodiment of the heat-dissipating unit to be produced by the method of the present invention.

In the case of the heat-dissipating unit 40 shown in FIG. 11, both the upper and lower end surfaces of the pin 17 are each covered with an aluminum brazing material layer 41, and the pin 17 is made using a second plate member 22 formed of an aluminum brazing sheet with both surfaces each covered with an aluminum brazing material layer.

In the case of the heat-dissipating unit 40 shown in FIG. 11, simultaneously with the brazing of both the upper and lower constituent elements 9 and 11 of the casing 2 at the time of producing the cooling apparatus 1, the upper end surface of the upper fin 15 of the upper heat-dissipating unit 40 is brazed to the top wall 2a of the casing 2 and the lower end surface of the lower fin 15 is brazed to the intermediate plate 13, and the lower end surface of the lower fin 15 of the lower heat-dissipating unit 40 is brazed to the bottom wall 2b of the casing 2 and the upper end surface of the upper fin 15 is brazed to the intermediate plate 13.

Figure 12:
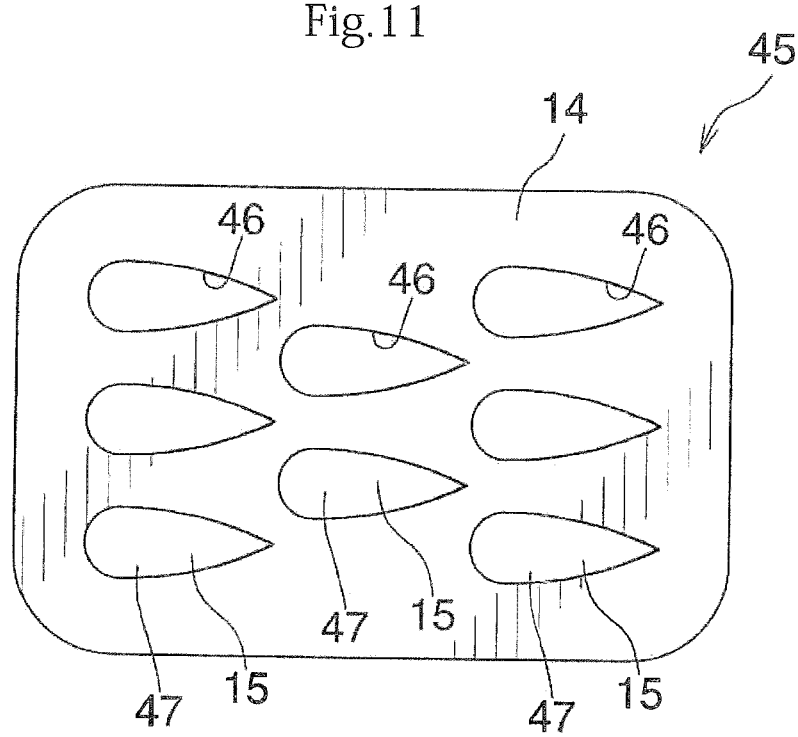
FIG. 12 is a plan view showing a fourth modified embodiment of the heat-dissipating unit to be produced by the method of the present invention.

In the case of the heat-dissipating unit 45 shown in FIG. 12, the shape of the through-hole 46 of the substrate 14 is a streamline shape in which the arc edges and the pointed edges of the through-holes 46 are oriented in the same direction. The cross-sectional shape of the pin is a streamline shape in which the arc edges and the pointed edges of the pins are directed in the same direction as the arc edges and the pointed edges of the through-holes, respectively. The shape of the pin 47 which will be served as the upper and lower fins 15 as seen from a plane is a streamline shape in which the arc edges and the pointed edges of the pins are oriented in the same direction as the arc edges and the pointed edges of the through-holes 46, respectively.

However, the shape of the through-hole 46 of the substrate 14 does not necessarily have an arc edge and a pointed edge facing in the same direction, respectively.

INDUSTRIAL APPLICABILITY

The method according to the present invention is suitably used for producing a heat-dissipating unit of a cooling apparatus for cooling a power device, such as, e.g., an IGBT, in a power module, such as, e.g., a power conversion device to be mounted on an electric vehicle, a hybrid vehicle, or a train.

The invention claimed is:

1. A method of producing a heat-dissipating unit, wherein the heat-dissipating unit comprises a substrate having a plurality of through-holes formed therein and a plurality of pins fixed to the substrate in a state in which the pins are inserted in the through-holes of the substrate with both longitudinal end portions of the pins protruded from the through-hole by a certain length, and portions of the pins protruding from the through-holes serve as fins, the method comprising:
  punching the plurality of pins out of a second plate member to produce the plurality of pins and inserting the plurality of pins into the plurality of through-holes formed in a first plate member for the substrate, wherein the punching and inserting steps are performed simultaneously.

2. The method of producing a heat-dissipating unit as recited in claim 1, further comprising:
  forming a certain number of the through-holes required for a single substrate in a substrate forming portion located at one end portion of the first plate member in which a plurality of substrate forming portions each having a size for forming one substrate is provided side by side in a longitudinal direction of the first plate member;
  thereafter inserting the pins into the through-holes of the substrate forming portion; and
  subsequently cutting the substrate forming portion in which the pins are inserted into the through-holes from the first plate member to produce a substrate.

3. The method of producing a heat-dissipating unit as recited in claim 2, further comprising:
  forming a plurality of half-punched-out pin forming portions protruding on one surface side of the second plate member in a pin punch-out portion located at one end portion of the second plate member in which the plurality of pin punch-out portions, each from which a certain number of pins required for one substrate are punched out, are provided side by side in a longitudinal direction of the second plate member, wherein
  the simultaneous punching and inserting includes punching the plurality of half-punched-out pin forming portions of the pin punch-out portion from the second plate member to produce the plurality of pins and inserting the plurality of pins into the through-holes of the substrate forming portion located at the one end portion of the first plate member.

4. The method of producing a heat-dissipating unit as recited in claim 3, further comprising:
  performing a step A of forming the through-holes in the substrate forming portion of the first plate member; a step B of subjecting the pin punch-out portion of the second plate member to a half-punch-out process to form a half-punched-out pin forming portion protruding on one surface side of the second plate member; a step C of punching the pin forming portion from the second plate member to form the pins and simultaneously inserting the pins into the through-holes of the substrate forming portion of the one end portion of the first plate member; and a step D of cutting the substrate forming portion in which the pins are inserted into the through-holes from the first plate member to produce the substrate by a single die.

5. The method of producing a heat-dissipating unit as recited in claim 4, further comprising:

performing a step E of cutting the pin punch-out portion from the second plate member after forming the plurality of pins from the pin punch-out portion located at one end portion of the second plate member, wherein the step E is performed by the die for performing the steps A to D.

6. The method of producing a heat-dissipating unit as recited in claim 5, further comprising:

arranging a first coil in which the first plate member is wound and a second coil in which the second plate member is wound so that feeding directions of both the plate members from both the coils are orthogonal as seen from a plane; and performing the steps A to E while intermittently feeding the first plate member from the first coil and intermittently feeding the second plate member from the second coil.

7. The method of producing a heat-dissipating unit as recited in claim 1, further comprising:

preparing a substrate having a required number of through-holes using the first plate member.

8. The method of producing a heat-dissipating unit as recited in claim 1, wherein the second plate member is made of JIS A1000 series aluminum.

9. The method of producing a heat-dissipating unit as recited in claim 1, wherein the second plate member is made of JIS A6000 series aluminum.

10. The method of producing a heat-dissipating unit as recited in claim 1, wherein when the pins are inserted into the through-holes of the first plate member, the pins are press-fitted therein.

11. The method of producing a heat-dissipating unit as recited in claim 1, wherein a brazing material layer is provided on at least one surface of the first plate member.

12. The method of producing a heat-dissipating unit as recited in claim 1, wherein a brazing material layer is provided on at least one surface of the second plate member.

13. The method of producing a heat-dissipating unit as recited in claim 1, wherein a cross-sectional shape of each of the pins to be punched is circular, and a ratio L/D of a length L of each of the pins to a diameter D is 1.7 or less.

14. The method of producing a heat-dissipating unit as recited in claim 1, wherein a shape of the through-hole of the first plate member is a streamline shape, and a cross-sectional shape of each of the pins is a streamline shape having an arc edge and a pointed edge oriented in a same direction as an arc edge and a pointed edge of the through-hole, respectively.

* * * * *